United States Patent [19]
Chung

[11] Patent Number: 5,418,807
[45] Date of Patent: May 23, 1995

[54] HIGH POWER, HIGH PULSE REPETITION FREQUENCY, COMPACT, PULSED LASER DIODE DRIVER

[76] Inventor: Hyung Dong Chung, 1-601 Jam Won Family Apt., Jam Won Dong, Seocho Ku, Seoul, Rep. of Korea

[21] Appl. No.: 215,287

[22] Filed: Mar. 21, 1994

[30] Foreign Application Priority Data

Feb. 8, 1994 [KR] Rep. of Korea .................. 94-2444

[51] Int. Cl.$^6$ ............................................. H01S 3/00
[52] U.S. Cl. ...................................... 372/38; 372/87
[58] Field of Search .......................... 372/82, 87, 38

*Primary Examiner*—Léon Scott, Jr.
*Attorney, Agent, or Firm*—Nolte, Nolte and Hunter

[57] ABSTRACT

A high power, high PRF, pulsed laser diode driver including an optically activated three terminal semiconductor switch, capable of generating high peak power light pulses with an ultra-narrow pulsewidth at a high PRF. The semiconductor laser driver includes a control unit for controlling an input drive signal, electric power conditioning and pulse charging unit for receiving said drive signal controlled in said control unit and thereby generating an electrical energy, energy storage unit for receiving said electrical energy from said electric power conditioning and pulse charging unit and storing the received electrical energy, triggering light source and drive unit for generating a low power, optical laser light when the electrical energy has been stored in the energy storage unit, optically activated semiconductor switch unit for converting the capacitively charged electrical energy into a high current impulse, and a high power laser array for converting said high current impulse received from said optically activated semiconductor switch unit into a high power, optical pulse to be outputted. The optically activated semiconductor switch unit is a three terminal switch consisted of three electrodes.

3 Claims, 5 Drawing Sheets

HIGH POWER, HIGH PULSE REPETITION FREQUENCY, COMPACT, PULSED LASER DIODE DRIVER

BACKGROUND OF THE INVENTION

1. Field of the Invention

The present invention relates to a laser diode driver, and more particularly to a high power, high pulse repetition frequency (PRF), pulsed laser diode driver.

2. Description of the Prior Art

Generally, semiconductor laser drivers have a very high circuit impedance. Due to severe impedance mismatch between a laser driver having a high impedance and a semiconductor laser having an extremely low impedance, rather than the electrical energy is used to operate the semiconductor laser, most of it is lost in the form of heat.

For the operation of the high power semiconductor laser driver, current beyond threshold level should be supplied to the semiconductor laser driver. The lost energy has to be compensated.

Therefore, such a conventional high power, pulsed laser driver is designed with much high power capability, taking into consideration energy to be lost as well as energy required to operate the laser.

In the conventional high power, pulsed driver, as the lost energy is increased, the power capability goes up steeply. As a result, the capabilities of the laser driver such as the rise and fall times, pulsewidth and PRF of the output laser pulse deteriorates rapidly, while steeply increasing the size and weight of the driver.

For solving such problems encountered in the conventional laser driver, there has been proposed a high power, PRF, pulsed laser diode driver. This laser diode driver is disclosed in Korean Patent Application No. 94-2144 filed by the applicant.

This laser diode driver utilizes a non-uniform, low impedance stripline structure as its energy storage capacitor to obtain a highly efficient laser diode driver circuit. Further, in a matched impedance condition, two-way wave transit time of the non-uniform impedance stripline structure becomes the pulsewidth of the high power laser output pulses. Therefore, by properly designing the energy storage capacitor, laser output pulses having a pulsewidth with only a few nanoseconds are obtained.

However, due to practical reasons such as eye safety, effective distance, precision and high speed data communications, it is highly desirable to produce high peak power laser pulses with the pulsewidth much less than a few nanoseconds. For the generation of the high peak power, laser pulses with a few nanoseconds pulsewidth, utilization of the non-uniform impedance stripline structure as the energy storage capacitor is very effective way.

In an ideal operating condition, the shortest output laser pulse width, obtained from a non-uniform stripline structure, is about equal to the two-way wave transit time in this energy storage capacitor. Therefore, as the length of the non-uniform impedance stripline becomes short, accordingly, the pulsewidth of the laser output pulses becomes narrow. Hence, the output light pulses with a few nanoseconds pulsewidth is obtained by simply reducing the physical length of the energy storage capacitor until the two-way wave transit time of this capacitor becomes a few nanosecond.

But for the generation of the output laser pulses with pulsewidth less than a few nanoseconds, the thing is not that simple. Merely miniaturizing the physical length of the energy storage capacitor will not produce an ultra-narrow pulsewidth. There is limit. Too excessively miniaturized stripline which is required condition for the ultra-narrow pulsewidth (pulsewidth less than a few nanoseconds) could result in too small capacitance to store necessary electrostatic energy in the energy storage capacitor. Further, stray inductance will adversely affect the properties of the output pulses. Therefore, a new technique has to be devised.

SUMMARY OF THE INVENTION

Therefore, an object of the invention is to provide a high power, high PRF, pulsed laser diode driver including an optically activated three terminal semiconductor switch, capable of generating high peak power light pulses with an ultra-narrow pulsewidth at high PRF.

In accordance with the present invention, this object can be accomplished by providing a semiconductor laser driver comprising control means for controlling an input drive signal, electric power conditioning and pulse charging means for receiving said drive signal controlled in said control means and thereby generating an electrical energy, energy storage means for receiving said electrical energy from said electric power conditioning and pulse charging means and storing the received electrical energy, triggering light source and drive means for generating a low power, optical laser light when the electrical energy has been stored in the energy storage means, optically activated semiconductor switch means for converting the capacitively charged electrical energy into a high current impulse, and a high power laser array for converting said high current impulse received from said optically activated semiconductor switch means into a high power, optical pulse to be outputted, wherein said optically activated semiconductor switch means comprises a three terminal switch consisted of three electrodes.

BRIEF DESCRIPTION OF THE DRAWINGS

Other objects and aspects of the invention will become apparent from the following description of embodiments with reference to the accompanying drawings in which:

FIGS. 2b and 2c are cross-sectional views respectively taken along the line A—A and the line B—B of FIG. 2a;

DETAILED DESCRIPTION OF THE PREFERRED EMBODIMENTS

Figure 1:
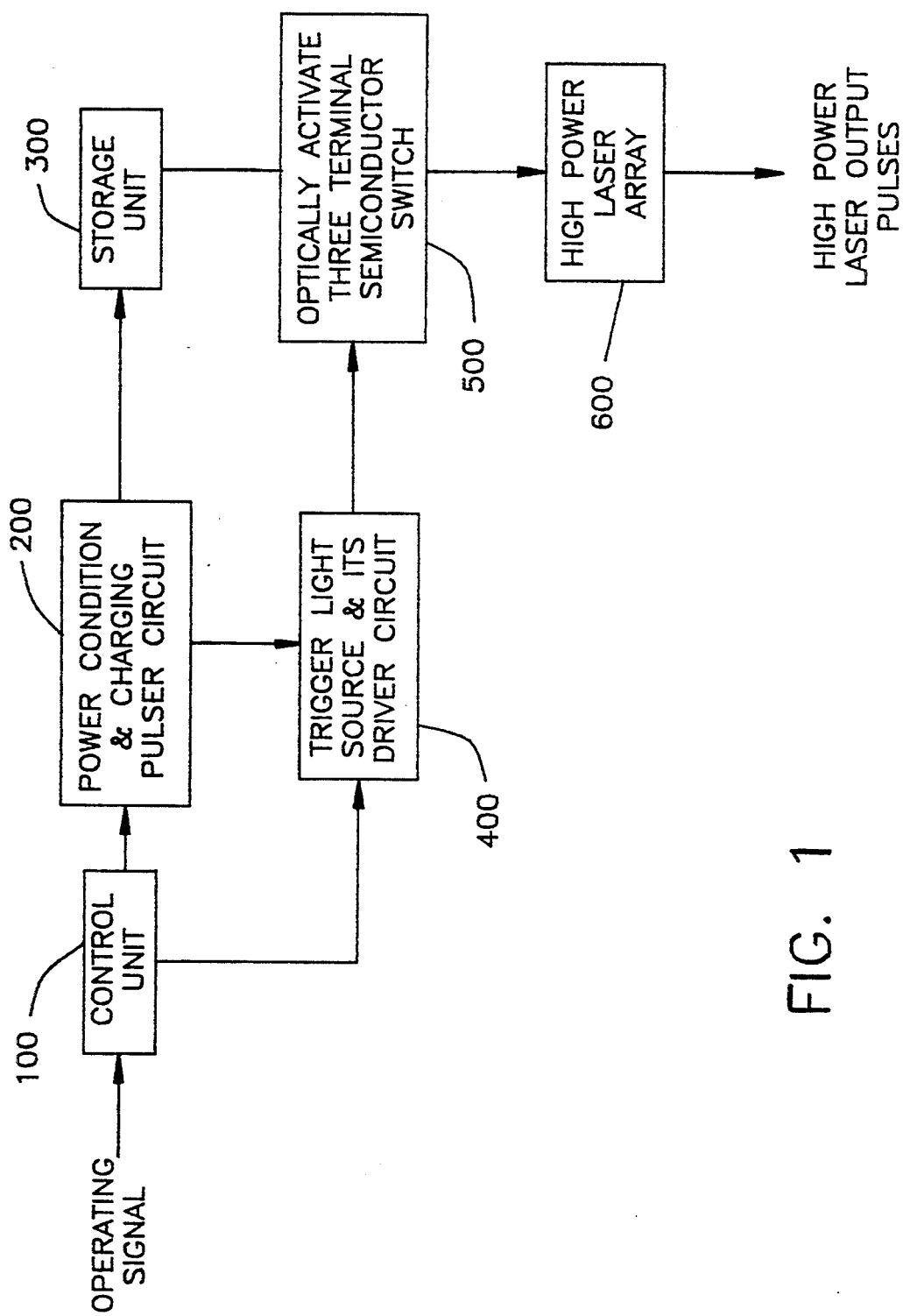
FIG. 1 is a block diagram of a laser diode driver in accordance with the present invention.

FIG. 1 is a block diagram of a high power, high PRF, compact, pulsed laser diode driver in accordance with the present invention. As shown in FIG. 1, the pulsed laser diode driver comprises a control unit 100, an electric power conditioning and pulse charging unit 200, an energy storage unit 300, a triggering light source and drive unit 400, an optically activated semiconductor switch unit 500, and a high power laser array 600.

The control unit 100 controls a signal introduced from an input stage and sends the controlled signal to the electric power conditioning and pulse charging unit 200. The control unit 100 also applies a signal to the triggering light source and drive unit 400.

The electric power conditioning and pulse charging unit 200 conditions the prime electrical energy derived from either AC power line or battery by the signal from the control unit 100 and then sends certain energy to the energy storage unit 300. The electric power conditioning and pulse charging unit 200 also sends certain energy to the triggering light source and drive unit 400.

The energy storage unit 300 includes a low impedance capacitor having a non-uniform stripline structure and stores the energy received from the electric power conditioning and pulse charging unit 200.

The triggering light source and drive unit 400 is consisted of a medium or slightly high power laser diode with two fiber optic pigtails. The triggering light source and drive unit 400 serves to output optical laser light of low or middle power while being driven upon receiving the control signal from the control unit 100 when the energy storage in the energy storage unit 300 is completed.

The optically activated semiconductor switch unit 500 is a three terminal switch consisted of three electrodes. The switch unit 500 is turned on by the laser light received from the triggering light source and drive unit 400 to convert the capacitively charged electrostatic energy into the high current impulse.

The high power laser array 600 outputs the high current impulse converted in the optically activated semiconductor switch unit 500 in the form of high power, optical pulse.

By signal from the control unit 100, the prime electrical energy, derived from either AC power line or battery, is conditioned and then used to capacitively charging the energy storage unit 300. As the optical lights from the triggering optical source, delivered by two fiber optic pigtails of the triggering light source and drive unit 400, are introduced into the optically activated semiconductor switch unit 500, the capacitively charged electrostatic energy converts into the high current impulse.

The pulsewidth of the output laser light is determined by the time interval, δt, between two consecutive triggering optical light pulses. In particular, successful combination of the low impedance energy storage capacitor and the medium or slightly high power laser diode triggered three terminal semiconductor switch results in a compact, pulsed laser diode driver capable of generating high peak power light pulses with an ultra-narrow pulsewidth at high PRF.

Figure 2A:
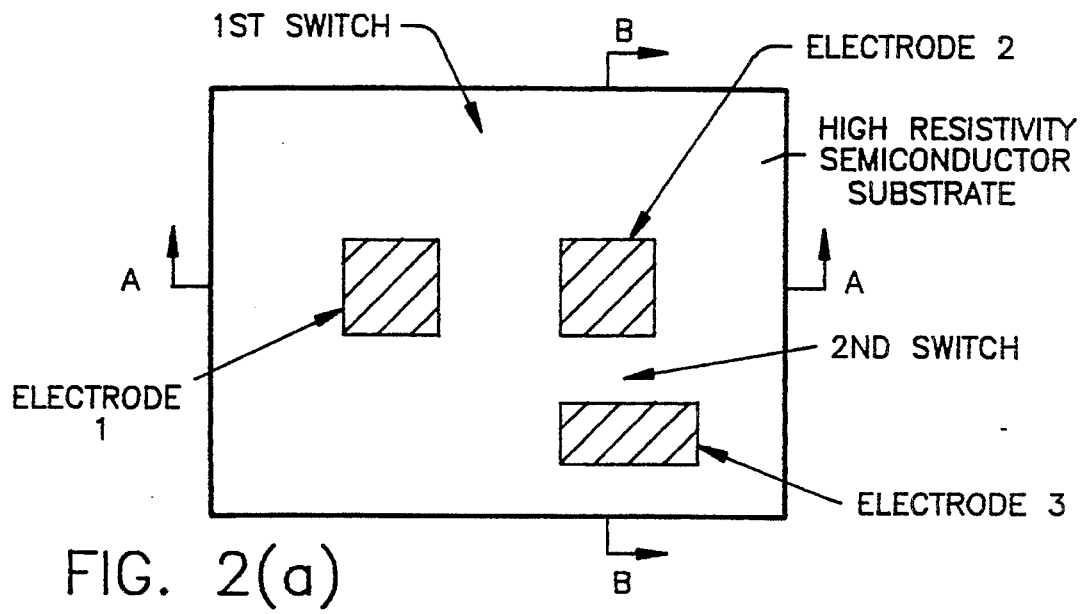
FIGS. 2a is a plan view illustrating an optically activated semiconductor switch unit in accordance with the present invention.
Figure 2B:
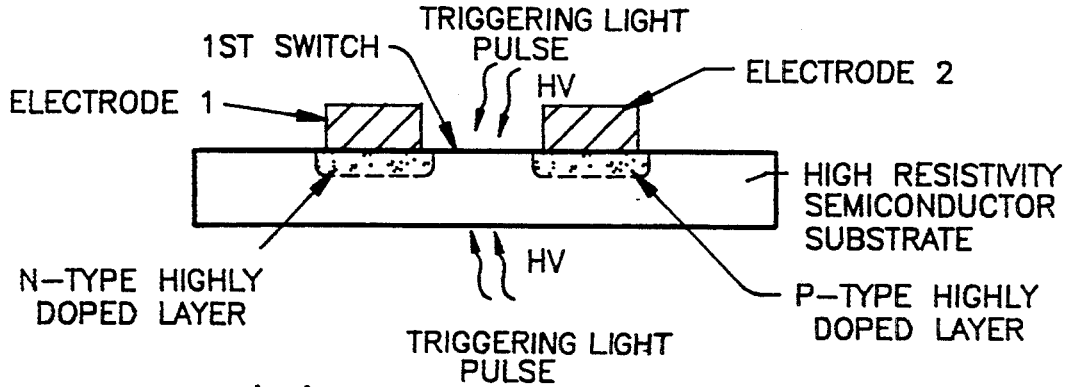
Figure 2C:
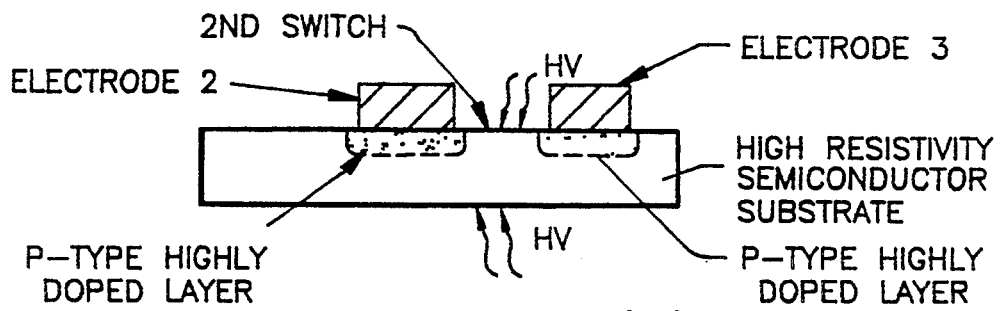

As shown in FIGS. 2a to 2c, the optically activated semiconductor switch unit 500 comprises a three terminal switch. This three terminal switch is consisted of three electrodes; an electrode 1, an electrode 2 and an electrode 3. The first switch, made by the electrodes 1 and 2, has a n-i-p structure, shown in FIG. 2b. The second switch, made by the electrodes 2 and 3, has a p-i-p structure, shown in FIG. 2c.

The main function of these switches is controlling the duration of the electrical energy flow into the high power laser array by the laser light pulse. Initially (without the triggering laser light illumination), both switches maintain an open circuit (switch-off). As the triggering laser light pulses (having a proper wavelength with sufficient optical power) are introduced into the active switch areas, conditions of both switches are changed from high resistivity (switchoff) to high conductivity (switch-on). (By the way, the triggering lights are introduced into the active switching areas, located in-between two electrodes, either from the top side or from the bottom).

However, the functions of these switches are quite different. The activation of the first switch by the laser light pulse initiates the electrical energy flow from the energy storage capacitor to the high power laser array. But the turn-on of the second switch by the time delayed light pulse with respect to the first light pulse creates a short circuit across the high power laser array so that the energy flow into the high power laser array is forced to be terminated.

Figure 3A:
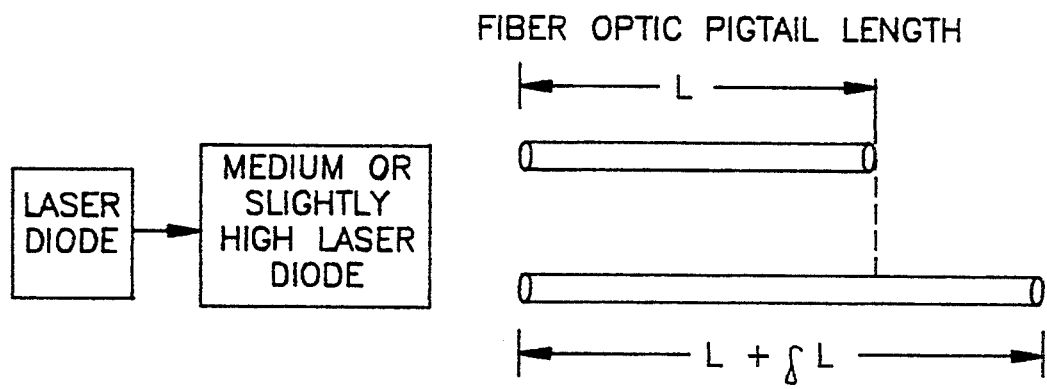
FIGS. 3a and 3b are schematic views respectively illustrating a triggering light source and drive unit in accordance with the present invention.
Figure 3B:
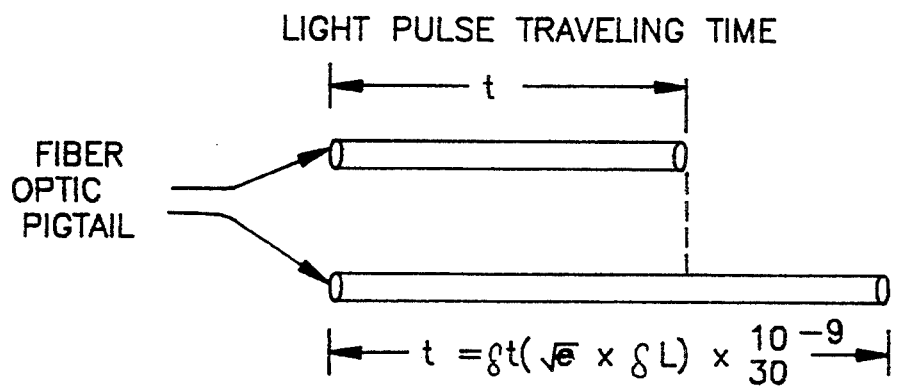

As shown in FIGS. 3a and 3b, the triggering light source and drive unit 400 is consisted of the medium (or slightly high) power laser diode with two fiber optic pigtails. The light pulse from the triggering laser diode is coupled into two fiber optic pigtails. The physical length difference, δt, between two consecutive light pulses, as shown in FIG. 3b. The mathematical formula governing the relationship between the fiber optic cable length, L, and the light pulse traveling time in this cable is given as follows:

$$L = (\sqrt{\epsilon_\gamma} \times L)/(3 \times 10^{+10} \text{cm}) \text{ seconds} \quad (1)$$

where L is the length of the fiber optic cable in cm and $\epsilon_\gamma$ is the dielectric constant of the core medium of the fiber optic cable. Hence, the time interval, δt, associated with the additional fiber optic cable length, δL, is given as follows:

$$\delta t = \{(\sqrt{\epsilon_\gamma} \times \delta L)/30\} \times 10^{-9} \text{ seconds} \quad (2)$$

Therefore, as the physical length difference, δL, decreases, the time interval, δt, between two consecutive light pulses becomes short so that an ultra-narrow pulsewidth of the high power laser pulses is obtained.

The action of the driver starts by forwarding the operating instruction to the control unit 100 which initiates sequence of actions. At first the electrical power conditioning and pulse charging unit 200 is activated. The prime power from either AC power line or battery is conditioned and used to pulse charging the capacitor of the energy storage unit 300. At the time the pulse biasing voltage of the capacitor reaches the peak voltage +V, the triggering light source and drive unit 400 is activated by the control signal from the control unit 100, as shown in FIGS. 3a and 3b.

The triggering light source and drive unit 400 generates a fast rise time optical pulse at very high PRF. The generated optical pulse, is coupled into the fiber optic pigtails, delivered through the fiber optic pigtails, and used to activate the semiconductor switch unit 500.

Once triggering optical light is penetrated into the active area of the semiconductor switch unit 500, it produces sufficient numbers of the photon-generated electron-hole pairs so that the state of the switch changes from completely open (non-conducting) to completely closing (conducting).

When the first switch, made by the electrodes 1 and 2 of the optically activated semiconductor switch unit 500, shown in FIG. 2b, is turned on by the triggering light pulse (delivered through the fiber optic cable length L), the electrostatic energy stored in the capacitor starts to flow into the high power laser array. Soon after the first switch is turned on, the second switch, made by the electrodes 2 and 3 of the optically activated semiconductor switch unit 500, shown in FIG. 2c, is turned on by the triggering optical pulse (delivered through the fiber optic cable length $L+\delta L$ to create shorting channel across the high power laser array. Once the short circuit is established, the electrical energy flow into the high power laser array is abruptly terminated.

In the case of the severe impedance mismatch case, the pulsewidth of the output laser light becomes wide and it fall time is slow. This is mainly due to the multi-reflections of the traveling wave, caused by the severely mismatched impedance. However, in a well-matched impedance case, the pulsewidth of the output laser light is about two-way wave transit time in the energy storage capacitor of the energy storage unit 300.

Figure 4:
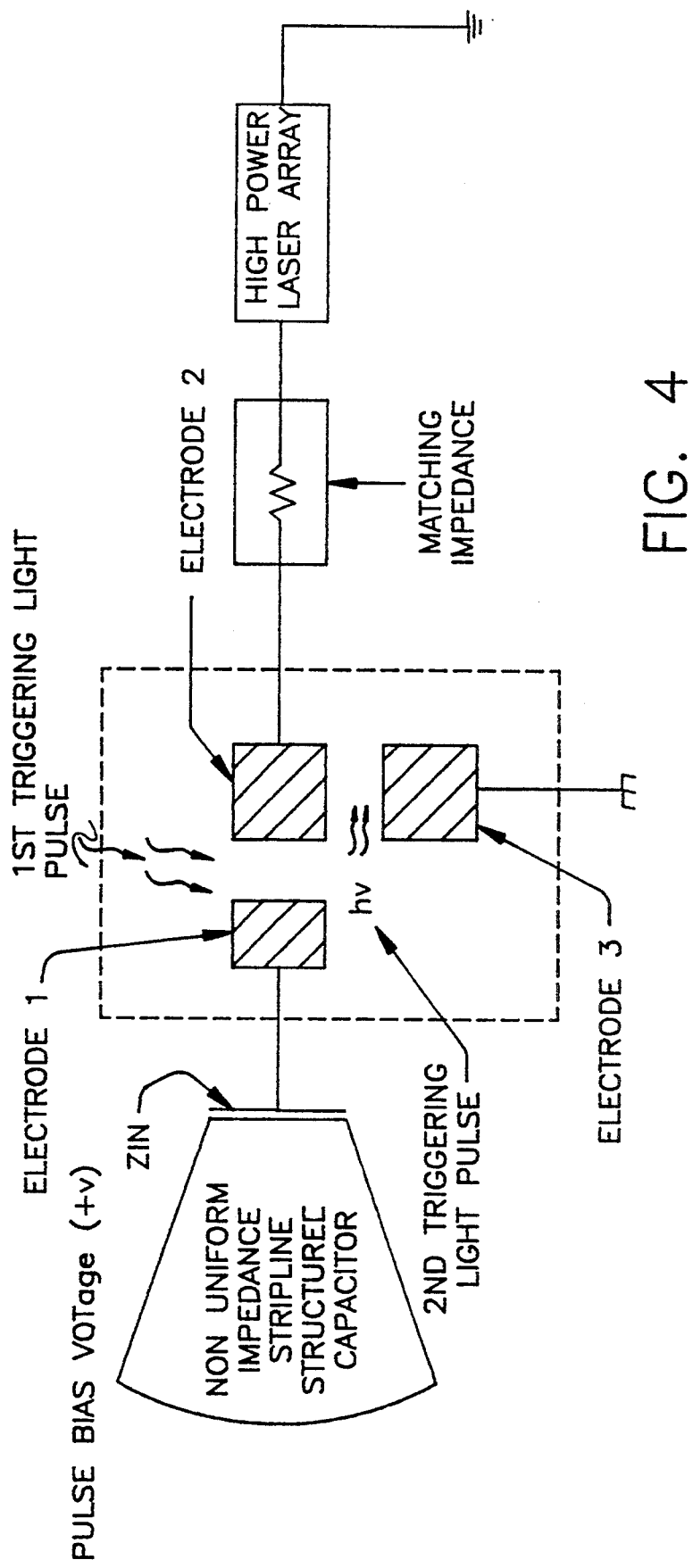
FIG. 4 is a block diagram illustrating an energy storage unit, the optically activated semiconductor switch unit, a matching impedance and a laser array in accordance with the present invention.

FIG. 4 is a block diagram illustrating the energy storage unit, the optically activated semiconductor switch unit, the matching impedance and the laser array. On the other hand, FIGS. 5a to 5c are waveform diagrams respectively illustrating the graphical sequences of the energy flow of the laser driver.

Figure 5A:
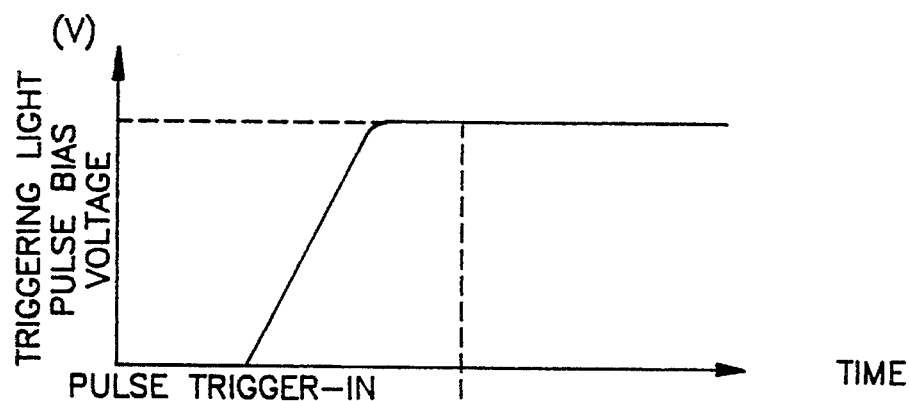
FIGS. 5a to 5c are waveform diagrams respectively illustrating the graphical sequences of the energy flow of the laser driver in accordance with the present invention.

At first the energy storage capacitor, shown in FIG. 4, is pulse biased to voltage $+V$, shown in FIG. 5a (Under pulse bias voltage $+V$, the first switch becomes reverse biased). The first switch, shown in FIG. 2b, is turned on by illuminating the active switching area with the triggering light pulse, delivered through the fiber optic cable length, L.

Figure 5B:
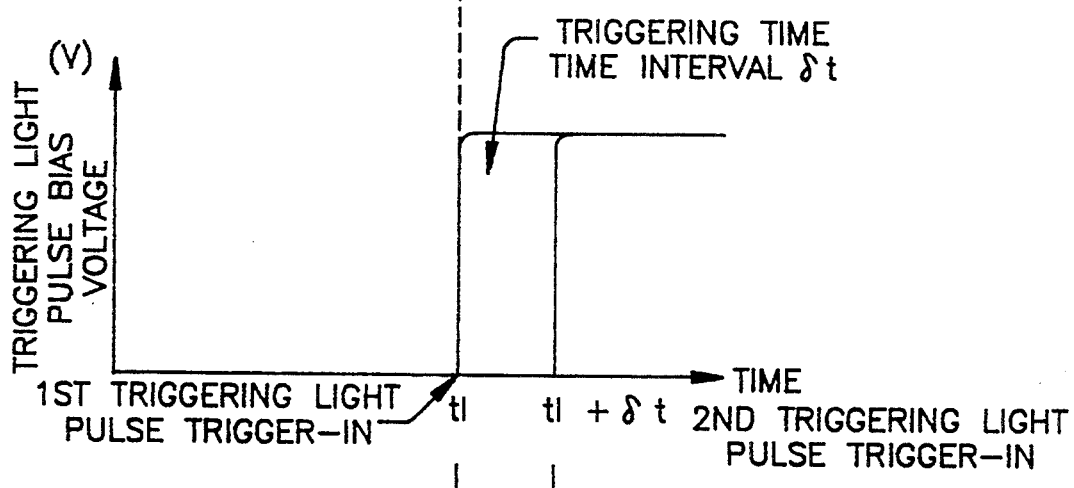
Figure 5C:
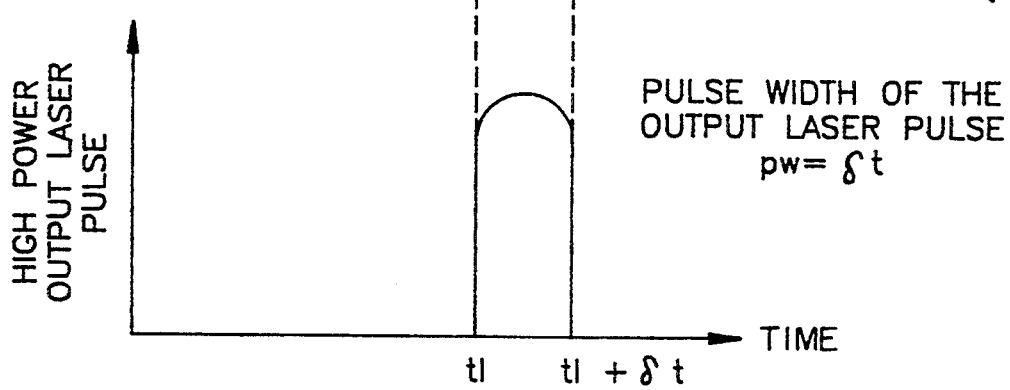

When the first switch is turned on, the electrostatic energy stored into the capacitor starts to flow toward the high power laser array, shown in FIG. 5b. The second switch, shown in FIG. 2c, is activated by introducing a triggering light pulse, delivered through the fiber optic cable length, $L+\delta L$. As soon as the second switch is turned on, a shorting channel is created across the high power laser array so that the electrical energy flow into the high power laser array is abruptly terminated, shown in FIG. 5c.

As apparent from the above description, the present invention provides a high power, high PRF, pulsed laser diode driver utilizing an optically activated three terminal semiconductor switch capable of controlling the duration of the energy flow into the high power laser array. By properly designing the time interval, $\delta t$, between tow fiber optic pigtails, optical pulses with an ultra-narrow pulsewidth can be produced.

In accordance with the present invention, the driver is able to generate high power laser output pulses with fast rise time and fast fall time at high PRF, by generating fast rise time optical pulse from the medium (or slightly high) power laser diode, coupling into two fiber optic pigtails, using them as the switch trigger lights and controlling the electrical energy flow into the high power laser array.

The geometrical effect of the non-uniform stripline structure in accordance with the present invention enables the design of a compact energy storage capacitor with very low impedance. This low impedance capacitor greatly reduce the energy loss during the energy transfer from the capacitor to the laser array. Unlike the conventional high power, pulsed laser driver, the resultant pulsed driver which is very efficient eliminates the need for the high-power power supply as well as the heat removing fan. Hence, the high power, ultra-narrow pulsewidth, pulsed laser driver utilizing a low impedance capacitor becomes very efficient, very compact and very light weight.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor laser driver comprising control means for controlling an input drive signal, electric power conditioning and pulse charging means for receiving said drive signal controlled in said control means and thereby generating an electrical energy, energy storage means for receiving said electrical energy from said electric power conditioning and pulse charging means and storing the received electrical energy, triggering light source and drive means for generating a low power, optical laser light when the electrical energy has been stored in the energy storage means, optically activated semiconductor switch means for converting the capacitively charged electrical energy into a high current impulse, and a high power laser array for converting said high current impulse received from said optically activated semiconductor switch means into a high power, optical pulse to be outputted, wherein said optically activated semiconductor switch means comprises a three terminal switch consisted of three electrodes.

2. A semiconductor laser driver in accordance with claim 1, wherein said three terminal switch comprises a first switch made by two of said three electrodes to have a n-i-p structure and a second switch made by one of said two electrodes of said first switch and the remaining one of said three electrodes to have a p-i-p structure.

3. A semiconductor laser driver in accordance with claim 1, wherein both of said switches serve to maintain an open circuit at an initial state that no triggering laser light is illuminated and change their conditions from a high resistivity condition to a high conductivity condition at a state that triggering laser light pulses are introduced into active switch areas of the switches.

* * * * *